United States Patent [19]

Weigand

[11] Patent Number: 4,731,591
[45] Date of Patent: Mar. 15, 1988

[54] INDUCTIVE PROXIMITY SWITCH HAVING SWITCHED CAPACITOR FOR CONTROLLING HYSTERESIS

[75] Inventor: Reinhard Weigand, Amberg, Fed. Rep. of Germany

[73] Assignee: Siemens Aktiengesellschaft, Munich, Fed. Rep. of Germany

[21] Appl. No.: 941,014

[22] Filed: Dec. 12, 1986

[30] Foreign Application Priority Data

Dec. 12, 1985 [DE] Fed. Rep. of Germany ....... 3543935

[51] Int. Cl.⁴ .......................... G01V 3/11; H03B 5/12
[52] U.S. Cl. ...................................... 331/65; 324/207; 324/236; 324/327; 331/117 R
[58] Field of Search ..................... 331/65, 117 R, 167; 324/327, 207, 208, 222, 225, 236, 237; 340/686

[56] References Cited

U.S. PATENT DOCUMENTS 4,543,527  9/1985  Schuchmann et al. ........... 331/65 X

FOREIGN PATENT DOCUMENTS 1966178  1/1972  Fed. Rep. of Germany .
2113556  9/1972  Fed. Rep. of Germany .
2110146  5/1972  France .

Primary Examiner—Siegfried H. Grimm
Attorney, Agent, or Firm—Kenyon & Kenyon

[57] ABSTRACT

An inductive proximity switch which consists of an oscillator with an externally controllable resonant circuit as well as of a switching amplifier controllable by the oscillator. It further has a feed or biasing circuit for the oscillator and the switching amplifier. Connected in parallel with the capacitor of the resonant circuit is a capacitor with an electronic switch, the electronic switch being responsive to the output of the switching amplifier. Thereby a simple switching hysteresis is obtained.

2 Claims, 1 Drawing Figure

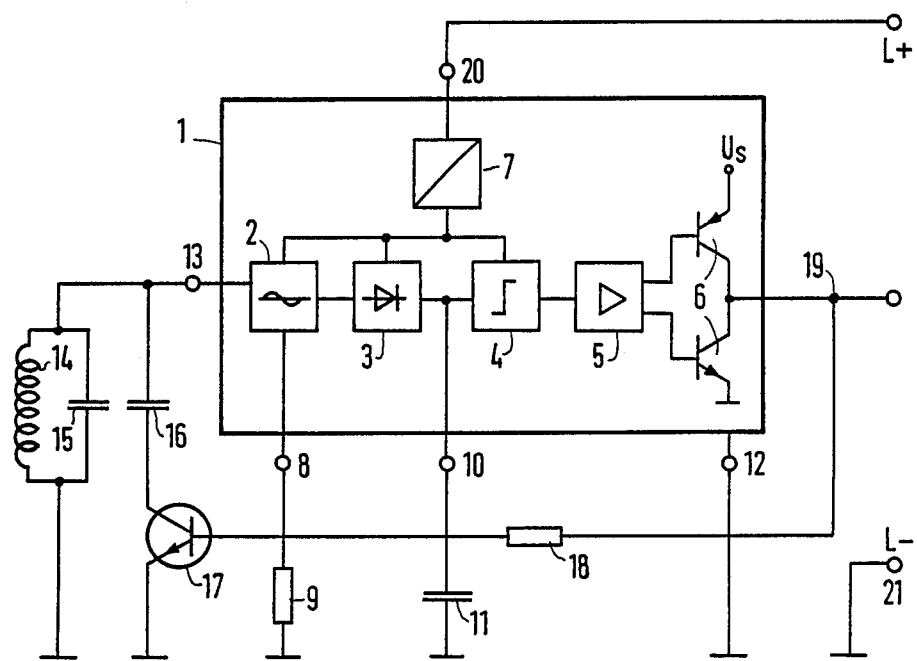

INDUCTIVE PROXIMITY SWITCH HAVING SWITCHED CAPACITOR FOR CONTROLLING HYSTERESIS

BACKGROUND OF THE INVENTION a. Field of Invention

The invention relates to an inductive proximity switch, with means for providing hysteresis therein.

b. Description of the Prior Art

Proximity switches are known (see for example DE-PS No. 19 66 178), in which the switching distance is adjusted via the emitter resistor of an oscillator transistor, i.e. this emitter resistor can assume different values from device to device. However, if, for the generation of hysteresis, another constant resistor is connected in parallel with this emitter resistor, the value of the total parallel connection also changes from device to device. Thus hysteresis may be different from device to device even with a constant hysteresis resistor.

SUMMARY OF THE INVENTION

It is, therefore, the object of the present invention to provide a hysteresis in the inductive proximity switch of the above-mentioned kind which is independent of the trimming value of the proximity switch. This is achieved in a simple manner if the capacitor of the resonant circuit is connected in parallel with the series connection of a capacitor with an electronic switch, and the electronic switch is responsive to the output of the switching amplifier. This makes it possible, in proximity switches where the emitter resistor is connected in parallel with another temperature compensation resistor for the formation of the constant switching distances independently of temperature fluctuations, to maintain the hysteresis largely constant, since the temperature dependence of the resonant circuit capacitors is substantially less than that of resistors. When using integrated resonant circuits in inductive proximity switches, generally the resonant circuit is connected on the internal mass. To this end a circuit has proved advantageous where the electric switch is a transistor operated in common emitter connection.

BRIEF DESCRIPTION OF THE FIGURE

The FIGURE illustrates a circuit diagram for the preferred embodiment of an inductive proximity switch with hysterisis in accordance with this invention.

DETAILED DESCRIPTION OF THE INVENTION

Referring now to the Figure, an inductive proximity switch has an integrated circuit 1, which includes an oscillator 2, a rectifier 3, as well as threshold detector 4, a driver 5 and a push-pull output amplifier stage 6. the integrated circuit also includes a voltage regulator 7. At the terminal 8 of the integrated circuit 1 there is a resistor 9, which may be for example a temperature compensator which connects a transistor of oscillator 2 to ground. At the terminal 10 of the integrated circuit 1, which is connected to the output of the rectifier 3, and an integration capacitor 11 is connected to ground. The integrated circuit is grounded at terminal 12. At the input terminal 13 of the integrated circuit 1, the oscillator 2 is connected to a parallel resonant circuit consisting of the inductor 14 and capacitor 15 connected to ground. Connected in parallel with the capacitor 15 is a capacitor 16 and a collector coupled transistor 17. The base of transistor 17 is actuated by the output 19 of the proximity switch via a resistor 18. The voltage input 20 of the integrated circuit is connected in this embodiment to a positive line L+ of a power supply. The negative terminal of the power supply is designated by 21. The inductive proximity switch can be operated as a two-wire as well as a multiwire proximity switch.

The proximity switch operates as follows. The switch has an unattenuated state in which the output 19 is low. Therefore, the base of transistor 17, operating in a common emitter mode is thus approximately at ground potential, and hence transistor 17 does not conduct. As a metal object approaches the resonant circuit or more particularly the inductor 14, the amplitude of the resonant circuit output decreases. When the amplitude of the resonant circuit reaches a determined level, the output at terminal 19 of the circuit 1 becomes high, so that transistor 17 starts conducting. Thereby the capacitor 15 is connected in parallel with the capacitor 16, as a result of which the resonant frequency of the oscillator, and hence the sensitivity curve thereof changes. This results in the desired switching hysteresis, independently of the magnitude of the biasing emitter resistor 9.

What is claimed is:

1. An inductive proximity switch comprising:
    a resonator circuit having a resonator frequency and an output which changes in the proximity of an external object, said resonator circuit including a first capacitor;
    an oscillator coupled to said resonator output and having an oscillator output coupled to means for generating an amplifier output;
    a second capacitor; and
    switching means responsive to said amplifier output for switching said second capacitor in parallel with said first capacitor for changing said resonator frequency.

2. The proximity switch of claim 1 wherein said switching means comprises a transistor operated in a common emitter mode.

* * * * *